(12) United States Patent
Nakamura

(10) Patent No.: US 6,381,143 B1
(45) Date of Patent: Apr. 30, 2002

(54) CARD-TYPED ELECTRONIC APPARATUS HAVING A FLAT CARD CASE HOUSING A PLURALITY OF ELECTRONIC PARTS

(75) Inventor: Koichiro Nakamura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/664,401

(22) Filed: Sep. 18, 2000

(30) Foreign Application Priority Data

Dec. 17, 1999 (JP) .......................................... 11-359462

(51) Int. Cl.[7] ................................................ H05K 1/14
(52) U.S. Cl. ........................ 361/737; 361/730; 361/728; 361/736; 235/492; 439/945; 439/946
(58) Field of Search ................................. 361/737, 730, 361/728, 736; 235/492; 439/945, 946

(56) References Cited

U.S. PATENT DOCUMENTS

| | | | |
|---|---|---|---|
| 5,196,994 A | * | 3/1993 | Tanuma et al. ............. 361/395 |
| 5,207,586 A | * | 5/1993 | MacGregor et al. .......... 439/76 |
| 5,505,628 A | | 4/1996 | Ramey et al. |
| 6,213,811 B1 | * | 4/2001 | Furusawa .................... 439/607 |
| 6,320,252 B1 | * | 11/2001 | Potters ........................ 257/679 |

\* cited by examiner

Primary Examiner—Jeffrey Gaffin
Assistant Examiner—Thanh S. Phan
(74) Attorney, Agent, or Firm—Finnegan, Henderson, Farabow, Garrett, Dunner, L.L.P.

(57) ABSTRACT

A card-type electronic apparatus is provided with a flat card case and a circuit module housed in the card case. The circuit module is provided with a circuit substrate having a first surface and a second surface positioned on the side opposite to the first surface, at least one first electronic part mounted on the first surface of the circuit substrate and at least one second electronic part mounted on the second surface of the circuit substrate. Here, the first electronic part having the greatest height dimension on the first surface and the second electronic part having the greatest height dimension on the second surface are placed in an offset manner from each other without facing each other with the circuit substrate interpolated in between. Moreover, the circuit substrate is provided with a step portion for allowing the first electronic part having the greatest height dimension on the first surface and the second electronic part having the greatest height dimension on the second surface to be shifted in an approaching direction with each other along the thickness direction of the card case.

18 Claims, 7 Drawing Sheets

CARD-TYPED ELECTRONIC APPARATUS HAVING A FLAT CARD CASE HOUSING A PLURALITY OF ELECTRONIC PARTS

CROSS-REFERENCE TO RELATED APPLICATIONS

This application is based upon and claims the benefit of priority from the prior Japanese Patent Application No. 11-359462, filed Dec. 17, 1999, the entire contents of which are incorporated herein by reference.

BACKGROUND OF THE INVENTION

The present invention relates to a card-type electronic apparatus such as a portable-type multi-media card having a built-in flash memory, and also to a method of manufacturing such a card-type electronic apparatus.

In recent years, portable-type multi-media cards having a build-in flash memory have come to be widely used. The multi-media cards of this type, which have a small-size and are easily used with high quality, are expected to be applied to portable-type information apparatuses such as portable telephones and multi-media apparatuses such as music players and digital cameras, as external storage media for storing video images requiring a large capacity, voice and other data.

The conventional multi-media card is constituted by a card case made of a synthetic resin and a memory module. The card case is standardized to have length and width dimensions corresponding to a small post-stamp size, and also to have a thickness of approximately 2 mm. This card case is constituted by a first case having a bottom wall and a second case having a top wall. The first case and the second case are joined to each other by aligning the outer circumferential edge of the bottom wall and the outer circumferential edge of the top wall face to face and fitting them to each other.

The memory module is housed inside the card case. The memory module has a circuit substrate and a plurality of electronic parts mounted on this circuit substrate. The circuit substrate is placed inside the card case in parallel with the bottom wall of the first case and the top wall of the second case. A plurality of power-apply terminals having a rectangular shape are placed on the front end of the circuit substrate. The power-apply terminals are aligned in a row in the width direction of the card case, and exposed to the outside of the card case through an opening formed in the bottom wall.

The electronic parts include a semiconductor package constituting a large capacity flash memory, an LSI chip and capacitors constituting a controller, etc., and these electronic parts are electrically connected to the power-apply terminals. For this reason, in the conventional multi-media card, the circuit substrate and the electronic parts are housed inside the card case in a stacked manner in the thickness direction of the card case.

The circuit substrate of the memory module has a first surface opposing the bottom wall of the first case and a second surface opposing the top wall of the second case. Here, in the conventional memory module, there are two cases in which the electronic parts are mounted on both of the first and second surfaces in a separate manner and in which all the electronic parts are mounted on either the first surface or the second surface of the circuit substrate as one lot.

In the case of the memory module with a circuit substrate having the electronic parts mounted on the first and second surfaces thereof, it is necessary to maintain inside the card case a space having a height dimension set by adding at least the thickness of the circuit substrate, the height of the electronic parts on the first surface and the height of the electronic parts on the second surface. Consequently, the thickness dimension of the card case is increased, causing a problem with the thinness of multi-media cards.

In the case of the memory module with a circuit substrate having the electronic parts mounted on only one side thereof, the circuit substrate can be placed along the bottom wall or the top wall of the card case. For this reason, it is possible to make the card case thinner.

In this structure, however, most of one surface of the circuit substrate is occupied by the mounting space of the electronic parts. Consequently, the power-apply terminals need to be placed on the surface of the circuit substrate opposite to the electronic parts. Here, since the power-apply terminals need to be exposed to the outside of the card case through the opening in the bottom wall, the circuit substrate needs to be placed along the bottom wall. This causes an extreme reduction in the dimension from the opening end of the opening to the power-apply terminals.

In other words, since the thickness of a multi-media card is as thin as approximately 2 mm, the thickness of the bottom wall of the card case needs to be as thin as approximately 0.3 mm. For this reason, it is not possible to provide a sufficient step between the outer surface of the bottom wall and the power-apply terminals. Consequently, for example, when a multi-media card is pinched by the hand, the finger tip tends to touch the power-apply terminals, with the result that the electronic parts might be seriously damaged by static electricity possessed by the human body. Moreover, a finger print or oil components from the finger tip might adhere to the power-apply terminals, resulting in disconnection.

Furthermore, in the conventional multi-media card, the card case is assembled by applying vibrational energy derived from ultrasonic waves to the butt portions of the first case and the second case and joining the two cases to each other. More specifically, the outer circumferential edge of the first case and the outer circumferential edge of the second case are aligned to butt against each other, and the outer circumferential edges of these cases are then pinched by a ultrasonic wave head and a fixed table; thus, in this state, the ultrasonic wave vibration is applied to the outer circumferential edges of the first and second cases. Consequently, the outer circumferential edges of the first and second cases are thermally melted and joined to each other all around the edges to form a card case.

In the conventional card case, the thickness dimension of the outer circumferential edges of the first and second cases is set to be constant all around the edges. For this reason, when the outer circumferential edge of the first case and the outer circumferential edge of the second case are aligned to butt against each other, the thickness of these butt portions becomes greater, thereby making the gap between the ultrasonic wave head and the fixed table greater. As a result, when the butt portions of the outer circumferential edge of the first case and the outer circumferential edge of the second case are subjected to ultrasonic wave vibration and allowed to melt, the capacity of the butt portions that are thermally affected becomes too great. Therefore, upon completion of the melt-joining of the first case and the second case, a thermal strain tends to occur in the outer circumferential portion of the card case, and the residual stress due to the thermal strain becomes greater.

Consequently, the card case might be deformed in a warping manner after the melt-joining process, and the flatness of the bottom wall and the top wall of the card case might be impaired. In addition, the above-mentioned residual stress tends to cause the outer circumferential portion of the card case to deform outwards in a swelling manner, resulting in degradation in the dimensional precision in the card case.

Moreover, in the conventional multi-media cards, the circuit substrate of a memory module is firmly fitted to the inside of the first case. Here, the outer circumferential edge of the first case is thicker and has a greater capacity in receiving the ultrasonic vibration; therefore, the ultrasonic vibration applied to the outer circumferential edge is not readily absorbed by the fixed table. For this reason, the ultrasonic vibration, applied to the outer circumferential edge of the first case, as it is, is allowed to reach the electronic parts through the circuit substrate, with the result that the precise electronic parts might be seriously damages by the ultrasonic vibration, or might be broken.

BRIEF SUMMARY OF THE INVENTION

It is a first object of the present invention to provide a card-type electronic apparatus which, in spite of its structure having electronic parts mounted on both of first and second surfaces of its circuit substrate, can provide a thin, compact card case.

It is a second object of the present invention to provide a card-type electronic apparatus in which the power-apply terminals can be placed in a recessed position inside an opening, thereby making it possible to prevent the power-apply terminals from being touched by the hand.

It is a third object of the present invention to provide a card-type electronic apparatus which can prevent deformation in the card case caused by ultrasonic wave melt-joining, thereby making it possible to improve the dimensional precision in the card case, and which also makes the ultrasonic vibration applied at the time of the melt-joining of the card case less likely to be transmitted to the electronic parts, thereby making it possible to prevent the electronic parts from being damaged.

In order to achieve the first object, the card-type electronic apparatus of the present invention is provided with a flat card case and a circuit module housed in the card case. The circuit module is provided with a circuit substrate having a first surface and a second surface positioned on the side opposite to the first surface, at least one first electronic part mounted on the first surface of the circuit substrate and at least one second electronic part mounted on the second surface of the circuit substrate. Here, the first electronic part having the greatest height dimension on the first surface and the second electronic part having the greatest height dimension on the second surface are placed in an offset manner from each other without facing each other with the circuit substrate interpolated in between. Moreover, the circuit substrate is provided with a step portion for allowing the first electronic part having the greatest height dimension on the first surface and the second electronic part having the greatest height dimension on the second surface to be shifted in an approaching direction with each other along the thickness direction of the card case.

With this arrangement, the first electronic part having the greatest height dimension on the first surface and the second electronic part having the greatest height dimension on the second surface are shifted in a manner so as to approach each other along the thickness direction of the circuit substrate. Thus, a space to be maintained inside the card case so as to house the memory module is set to a smaller height dimension obtained by subtracting the gap of the step portion of the circuit substrate from a value obtained by adding the heights of the first and second electronic parts having the greatest heights to the thickness of the circuit substrate. Consequently, as compared with the conventional apparatus having a flat circuit substrate, the card case can be made thinner by a dimension corresponding to the gap of the step portion. Therefore, although it has a construction with a circuit substrate having electronic parts mounted on both of the first and second surfaces, this construction still makes it possible to provide a thinner, compact card case.

Moreover, in order to achieve the first object, the card-type electronic apparatus of the present invention is provided with a flat card case and a circuit module housed in the card case. The circuit module is provided with a circuit substrate having a first surface and a second surface positioned on the side opposite to the first surface, at least one first electronic part mounted on the first surface of the circuit substrate and at least one second electronic part mounted on the second surface of the circuit substrate. Here, the first electronic part having the greatest height dimension on the first surface and the second electronic part having the greatest height dimension on the second surface are placed in an offset manner from each other without facing each other with the circuit substrate interpolated in between. Moreover, the circuit substrate is inclined along the thickness direction of the card case so that this inclined structure allows the first electronic part having the greatest height dimension on the first surface and the second electronic part having the greatest height dimension on the second surface to be shifted in an approaching direction with each other along the thickness direction of the card case.

With this arrangement, it is possible to reduce the height dimension of a space to be maintained inside the card case so as to house the memory module. Therefore, although it has a construction with a circuit substrate having electronic parts mounted on both of the first and second surfaces, this construction still makes it possible to provide a thinner, compact card case.

Moreover, in order to achieve the second object, the card-type electronic apparatus of the present invention is provided with a flat card case having an opening and a circuit module housed in the card case. The circuit module is provided with a circuit substrate having a first surface on which a power-apply terminal that is exposed to the opening is placed, and a second surface positioned on the side opposite to the first surface, and an electronic part that is mounted at least on the second surface of the circuit substrate and that is electrically connected to the power-apply terminal. The circuit substrate is provided with a first mount area in which the power-apply terminal is positioned and a second mount area in which the electronic part is placed. The first mount area and the second mount area are offset from each other without overlapping with each other on the circuit substrate, and are shifted from each other along the thickness direction of the card case.

With this arrangement, the shifting direction of the first mount area is regulated so that the power-apply terminal can be shifted in a departing direction from the opening of the card case. For this reason, the power-apply terminal can be placed at a recessed position inside the opening, thereby preventing the power-apply terminal from being touched by the finger tip when the card case is pinched by the fingers. Therefore, it becomes possible to prevent the electronic part from being damaged by static electricity possessed by the human body, and also to prevent the power-apply terminal from finger prints and oil components from the finger tip.

In order to achieve the third object, the card-type electronic apparatus of the present invention is provided with a card case made of a synthetic resin, housing an electronic part. This card case includes a first case having an outer circumferential edge and a second case having an outer circumferential edge, and the outer circumferential edge of the first case and the outer circumferential edge of the second case are aligned to butt against each other, and integrally melt-joined to each other by applying ultrasonic wave vibration to these outer circumferential edges. Moreover, the card case is provided with a cut section that is cut out so as to reduce the thickness thereof and that is formed at a position corresponding to at least one portion of the outer circumferential edges; thus, the first and second cases are melt-joined to each other at least at the position corresponding to the cut section.

In order to achieve the third object, the card-type electronic apparatus of the present invention is provided with a card case made of a synthetic resin, which comprises a first case and a second case that is aligned to butt against the first case, at least either the outer circumferential edge of the first case or the outer circumferential edge of the second case being provided with a cut section that is cut out so as to reduce the thickness thereof, and an electronic part housed inside the card case.

The method of manufacturing this card-type electronic apparatus in accordance with the present invention is provided with a first step of allowing the electronic part to be interpolated between the first case and the second case, and a second step of aligning the outer circumferential edge of the first case and the outer circumferential edge of the second case so as to butt against each other, sandwiching the butt outer circumferential edges with a ultrasonic wave head and a table at least at the position corresponding to the cut section, and melt-joining the first case and the second case by applying ultrasonic vibration to the outer circumferential edge of the first case and the outer circumferential edge of the second case through the ultrasonic wave head.

With this card-type electronic apparatus, the outer circumferential edge of the first case and the outer circumferential edge of the second case are melt-joined to each other by applying ultrasonic wave vibration at the position corresponding to the cut section. At the position of the cut section, the thickness of the butt portions of the first case and the second case is reduced; therefore, when the butt portions of the two cases are subjected to ultrasonic wave vibration and allowed to melt, the butt portions have a capacity reduced by the cut section in receiving the ultrasonic vibration. Thus, it is possible to reduce the thermal strain occurring in the first and second cases, and consequently to reduce a residual stress due to the thermal strain.

As a result, it is possible to avoid cases in which, after the first and the second cases have been melt-joined, the card case is deformed in a warping manner, and the outer circumferential edges of the first and second cases are deformed outwards in a swelling manner; thus, it becomes possible to well-maintain the degree of flatness and dimensional precision of the card case.

Moreover, the existence of the cut section makes it possible to reduce the thickness of the butt portions of the first case and the second case so that the gap between the ultrasonic wave head and the table is narrowed. For this reason, the ultrasonic wave vibration applied to the butt portions of the first case and the second case is readily absorbed by the table. Therefore, the ultrasonic wave vibration is less likely to be transmitted to the electronic part inside the card case, thereby making it possible to prevent the electronic part from being damaged by the ultrasonic wave vibration beforehand.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring to Figures, an explanation will be given, of an ultra-small-size SD memory card that is one type of multimedia cards to which the first embodiment of the present invention is applied.

FIGS. 1 through 5 show an SD memory card 1 which is used as an external memory medium of, for example, portable information apparatuses such as portable telephones or multi-media apparatuses such as music players and digital cameras. The SD memory card 1 is provided with a card case 2 and a memory module 3 that is housed inside the card case 2.

The card case 2 is composed of a synthetic resin material such as a polycarbonate resin or an ABS resin. The card case 2 is set to have a width of 24 mm, a length of 32 mm and a thickness of 2.1 mm. Thus, the card case 2 has, for example, a size identical to a small-size stamp, which is suitable for the small size and lightweight of a portable information apparatus or a multi-media apparatus to which the card is applied.

Figure 2:
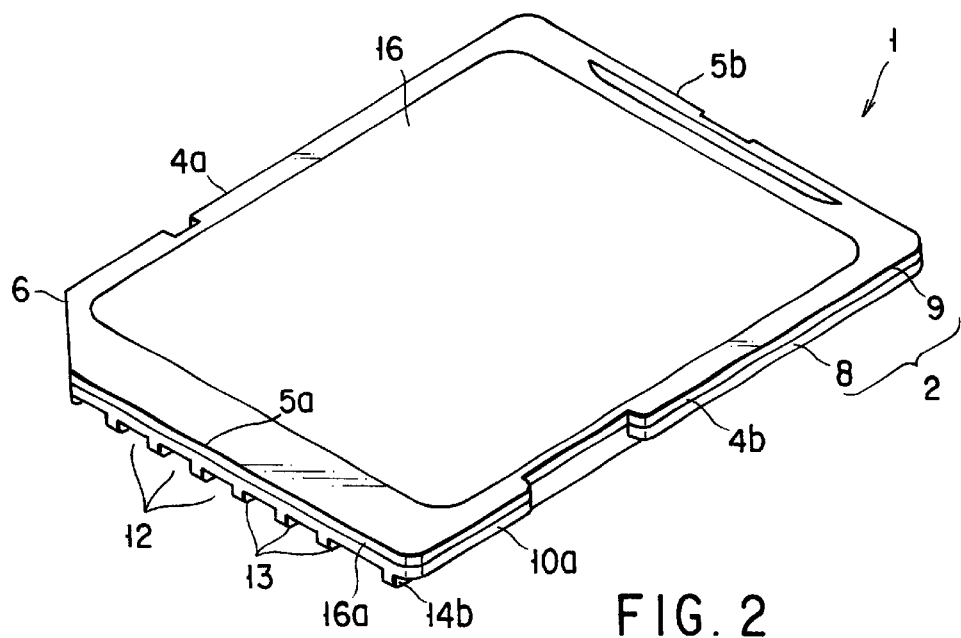
FIG. 2 is a perspective view of the SD memory card in accordance with the first embodiment of the present invention.
Figure 3:
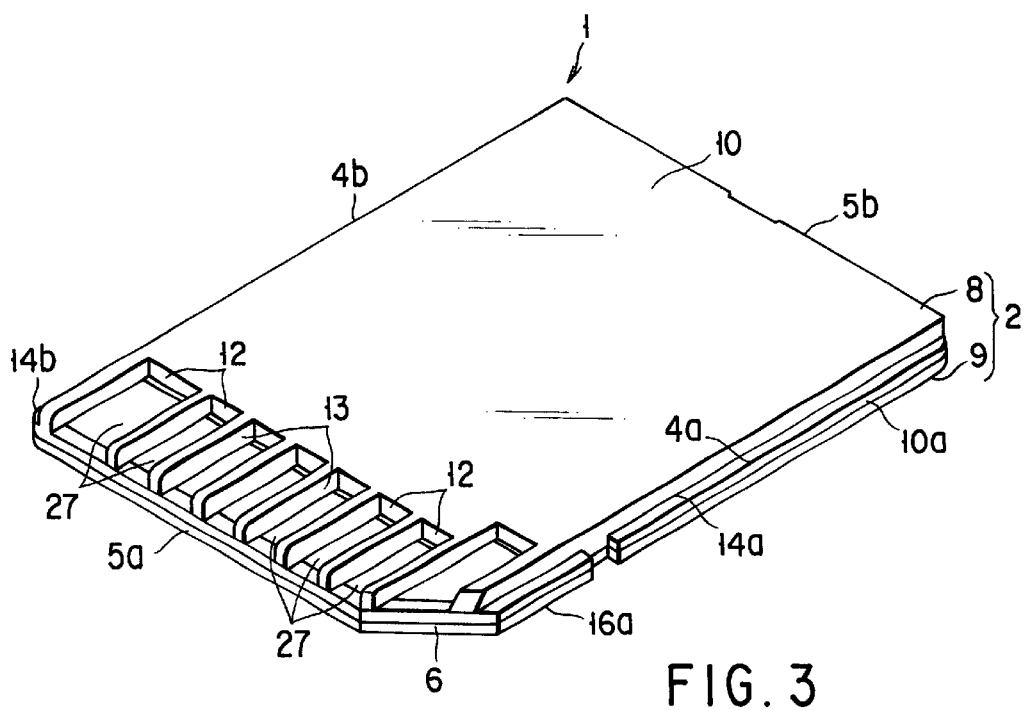
FIG. 3 is a perspective view of the SD memory card in accordance with the first embodiment of the present invention, which is obtained when a card case is viewed from a power-apply terminal side.

As illustrated in FIGS. 2 and 3, the card case 2 has a pair of long sides 4a and 4b extending in the length direction and a pair of short sides 5a and 5b extending in the width direction. Here, at one corner section made by one long side 4a and one short side 5a, a cutout 6 is formed so as to regulate the inserting direction of the SD memory card 1.

Figure 1:
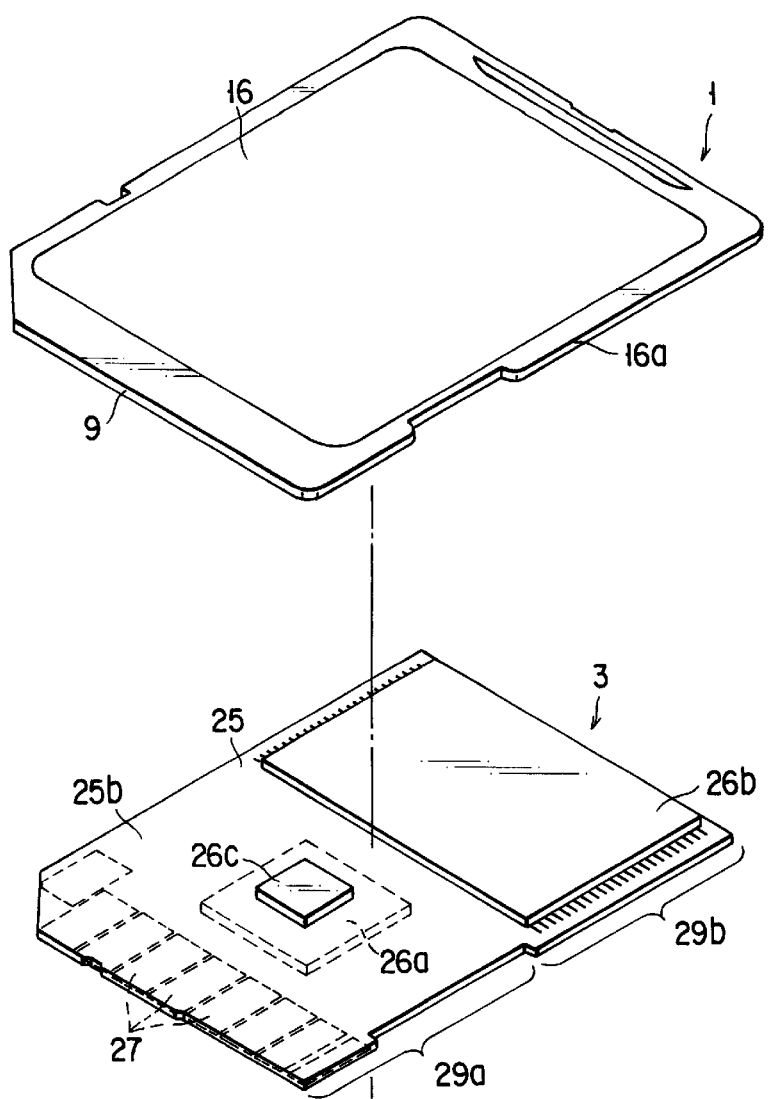
FIG. 1 is an exploded perspective view that shows an SD memory card in accordance with a first embodiment of the present invention.
Figure 1:
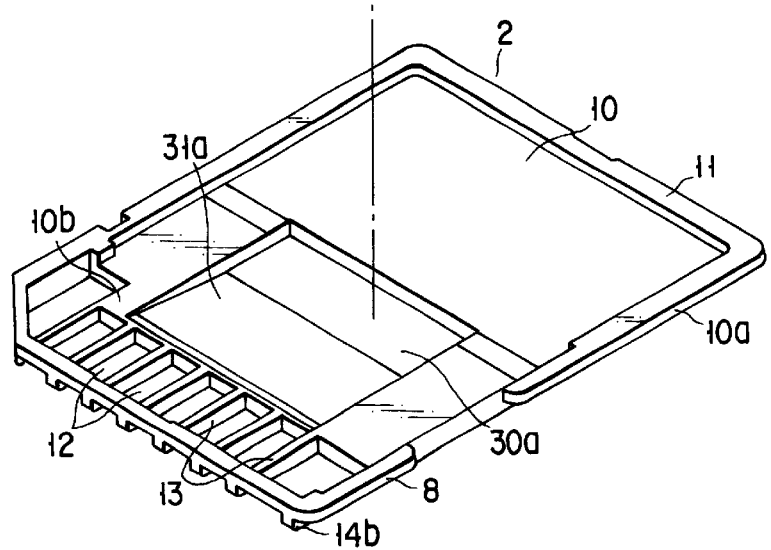
Figure 4:
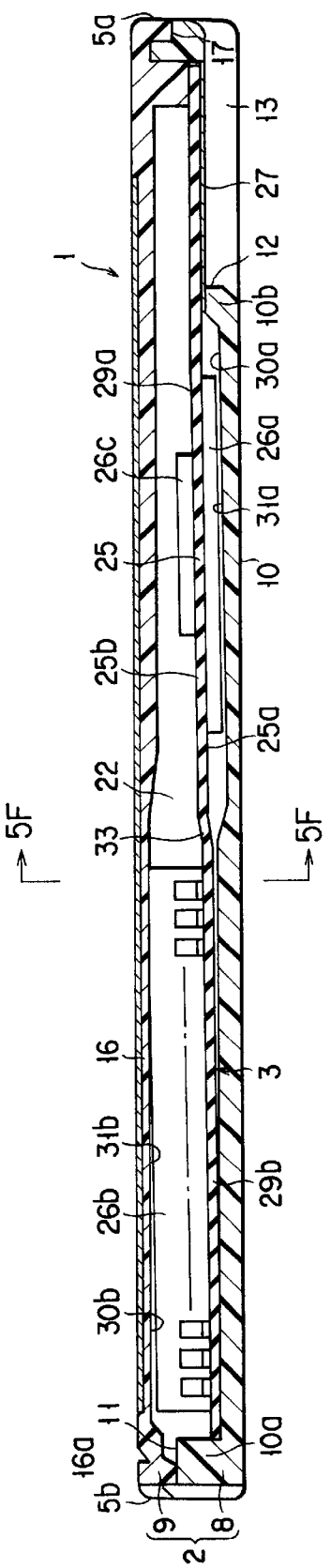
FIG. 4 is a cross-sectional view of the SD memory card in accordance with the first embodiment of the present invention.

As shown in FIG. 1 and FIG. 4, the card case 2 is provided with a first case 8 and a second case 9 that is aligned to butt against the first case 8. The first case 8 has a bottom wall 10. The bottom wall 10 serves as a first wall of the card case 2. The outer circumferential edge 10a of the bottom wall 10 continuously protrudes upward along the circumferential direction. The protruding end of the outer circumferential edge 10a forms a flat joining surface 11.

At the front end section of the bottom wall 10, a seat portion 10b which is thicker than the other portions is formed. The seat portion 10b extends in the width direction of the card case 2, and also expands upward from the bottom wall 10. The bottom wall 10 has a plurality of openings 12 that are open in the seat portion 10b. The openings 12 are aligned in one row in the width direction of the card case 2. The adjacent openings 12 are separated by a rib-shaped partition 13. The partition 13 stands in the thickness direction of the card case 2, and also extends in the length direction of the card case 2.

Figure 5:
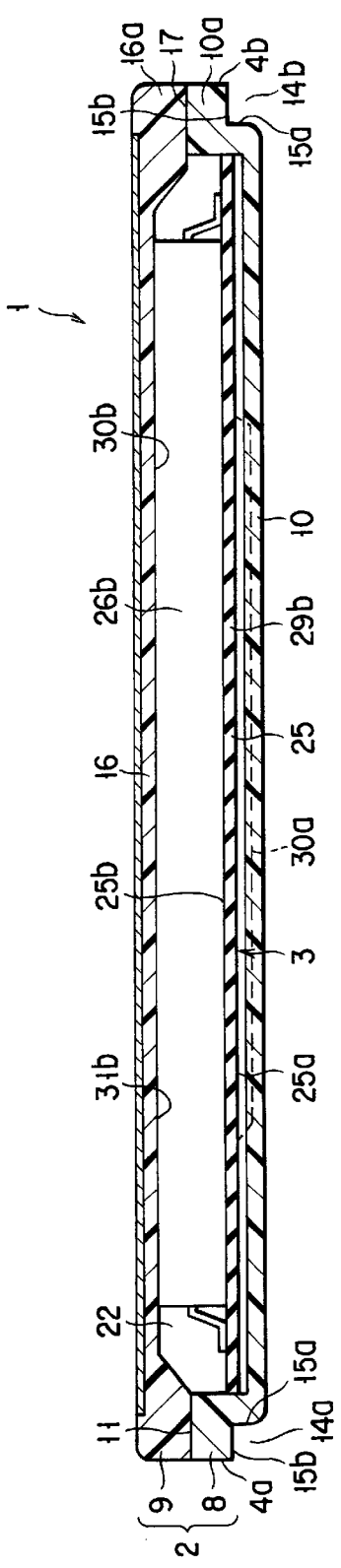
FIG. 5 is a cross-sectional view taken along line 5F—5F of FIG. 4.

As illustrated in FIG. 3 and FIG. 5, cut sections 14a and 14b are formed in portions of the outer circumferential edge 10a of the first case 8, which correspond to the long sides 4a and 4b of the card case 2. The cut sections 14a and 14b are formed by cutting out corner portions made by the side surface of the outer circumferential edge 10a and the bottom wall 10, and extend along the entire lengths of the long sides 4a and 4b. Each of these cut sections 14a and 14b has a first cut surface 15a that stands along the width direction of the card case 2 and a second horizontal cut surface 15b that is orthogonal to the first cut surface 15a. Thus, the portions of the outer circumferential edge 10a of the card case 2 corresponding to the long sides 4a and 4b are reduced in their thickness by the depths of the respective cut sections 14a and 14b.

Figure 6A:
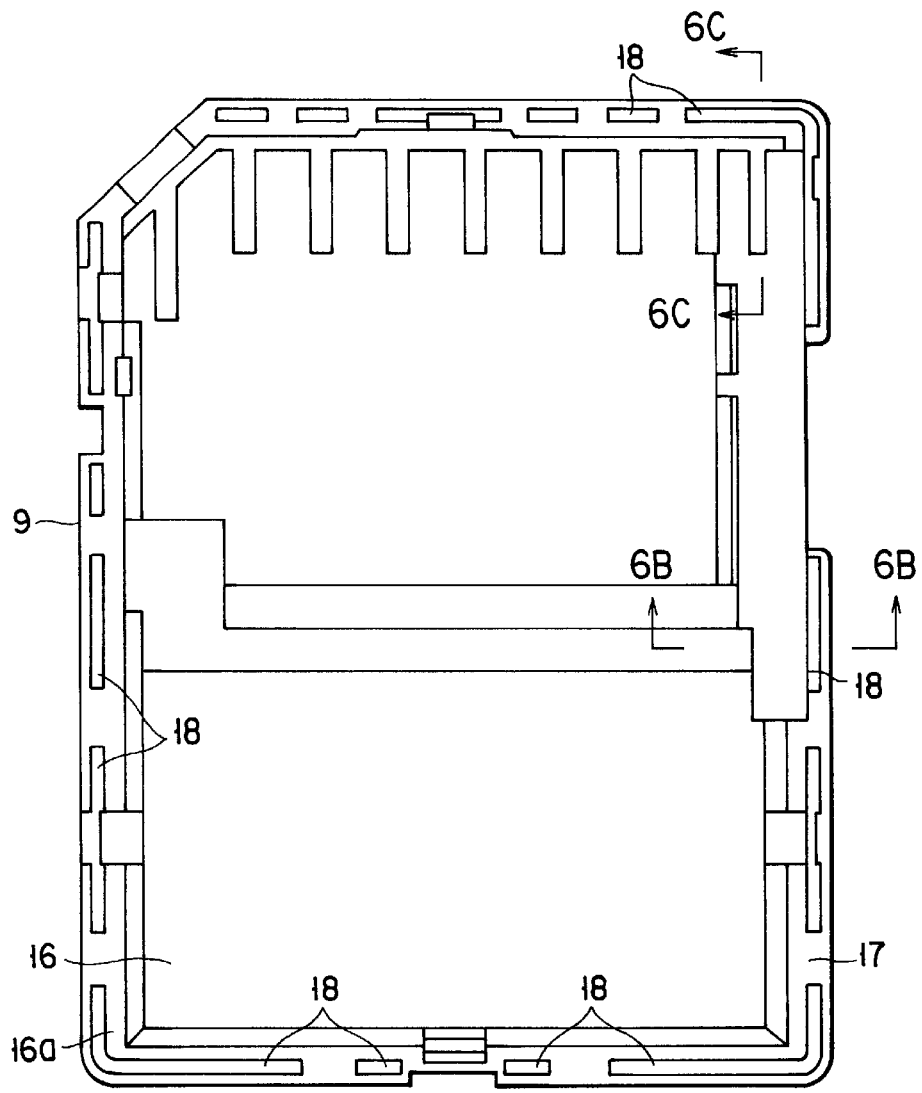
FIG. 6A is a plan view of the second case.
Figure 6B:
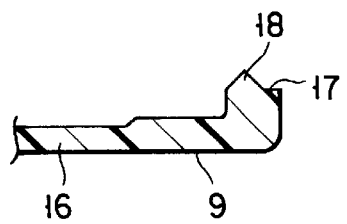
FIG. 6B is a cross-sectional view taken along line 6B—6B of FIG. 6A.
Figure 6C:
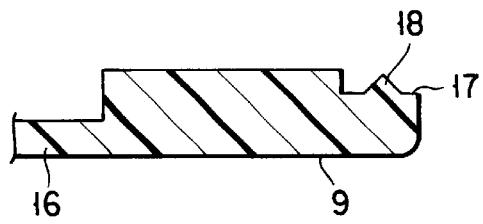
FIG. 6C is a cross-sectional view taken along line 6C—6C of FIG. 6A.
Figure 7A:
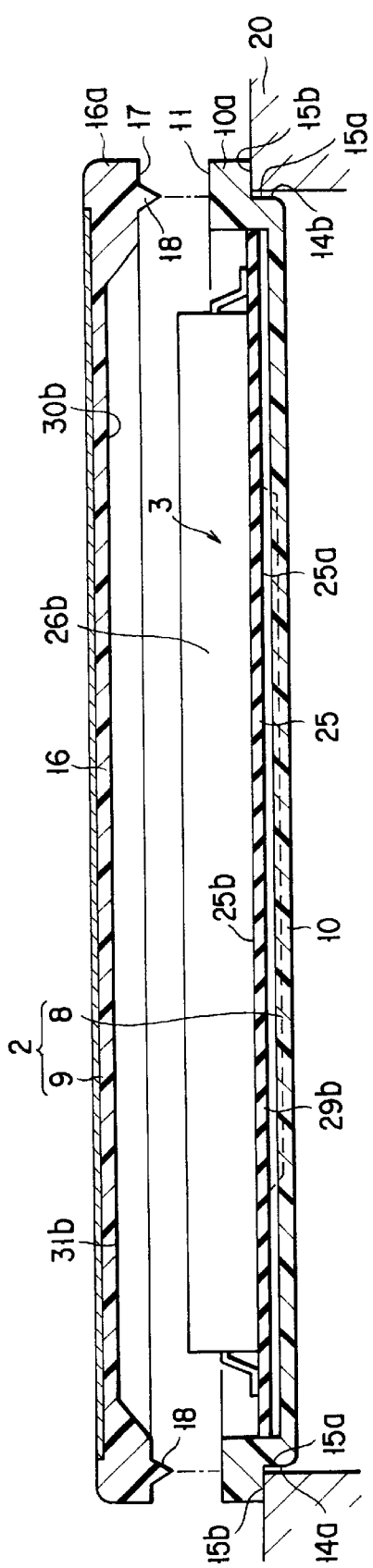
FIG. 7A is a cross-sectional view of the SD memory card of the first embodiment of the present invention, which shows the positional relationship between the joining surface of the first case and a melt-joining protrusion of the second case.

The second case 9 has a top wall 16. The top wall 16 serves as a second wall of the card case 2. The outer circumferential edge 16a of the top wall 16 continues in the circumferential direction, and protrudes downward. The protruding end of the outer circumferential edge 16a forms a flat butt surface 17. The butt surface 17 faces the joining surface 11 of the first case 8, and a plurality of melt-joining protrusions 18 are integrally formed on the butt surface 17. As illustrated in FIGS. 6B, 6C and 7A, the melt-joining protrusions 18 have a shape narrowed toward the top, and are placed along the outer circumferential edge 16a of the second case 9 in the circumferential direction with predetermined intervals.

The outer circumferential edge 10a of the first case 8 and the outer circumferential edge 16a of the second case 9 are aligned so as to butt against each other, and thermally melt-joined to each other by applying ultrasonic wave vibration to these butt portions. Upon melt-joining the cases 8 and 9, a fixed table 20 and a ultrasonic wave head 21 as shown in FIG. 7 are used.

Figure 7B:
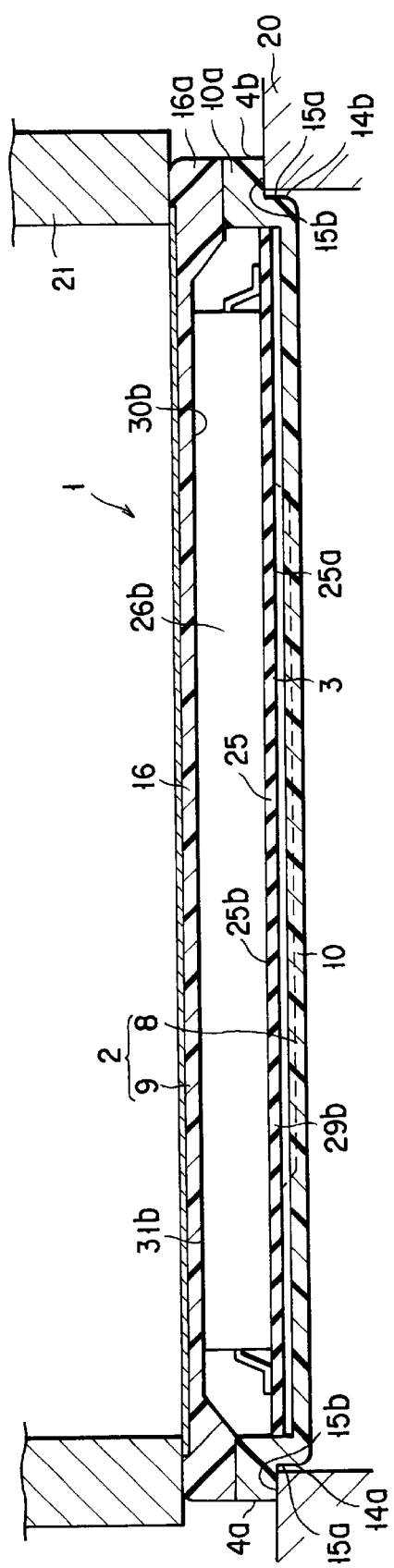
FIG. 7B is a cross-sectional view of the SD memory card of the first embodiment of the present invention, which shows a state in which the first case and the second case are melt-joined to each other through ultrasonic wave.

The fixed table 20 has a frame shape so as to surround the first case 8. The outer circumferential edge 10a of the first case 8 is placed on the fixed table 20. In this case, the cut sections 14a and 14b, cut out so as to reduce the thickness, are positioned at the portions of the outer circumferential edge 10a of the first case 8, which correspond to the long sides 4a and 4b of the card case 2. For this reason, as shown in FIG. 7A and FIG. 7B, portions of the fixed table 20 are inserted into the cut sections 14a and 14b, and the upper surface of the fixed table 20 comes into contact with the second cut surface 15b.

In a state where the outer circumferential edge 10a of the first case 8 and the outer circumferential edge 16a of the second case 9 are aligned so as to butt against each other, the tops of the melt-joining protrusions 18 are made in contact with the joining surface 11 of the outer circumferential edge 10a. The ultrasonic wave head 21 is in contact with an outer circumferential portion of the top wall 16 of the second case 9. The ultrasonic wave head 21 sandwiches the outer circumferential edges 10a and 16a of the first and second cases 8 and 9 in cooperation with the fixed table 20. For this reason, when ultrasonic wave vibration is applied to the outer circumferential portion of the top wall 16 through the ultrasonic wave head 21, the contact portion of the melt-joining protrusions 18 and the joining face 11 are allowed to melt through vibrational friction so that the joining surface 11 and the butt surface 17 are thermally melt-joined to each other. Consequently, the first case 8 and the second case 9 are joined to each other to be assembled as a card case 2.

As shown in FIG. 4 and FIG. 5, in a state where the first case 8 and the second case 9 are joined to each other, the bottom wall 10 and the top wall 16 are aligned face to face with each other. The bottom wall 10 and the top wall 16 form a flat receptacle 22 inside the card case 2.

Figure 8:
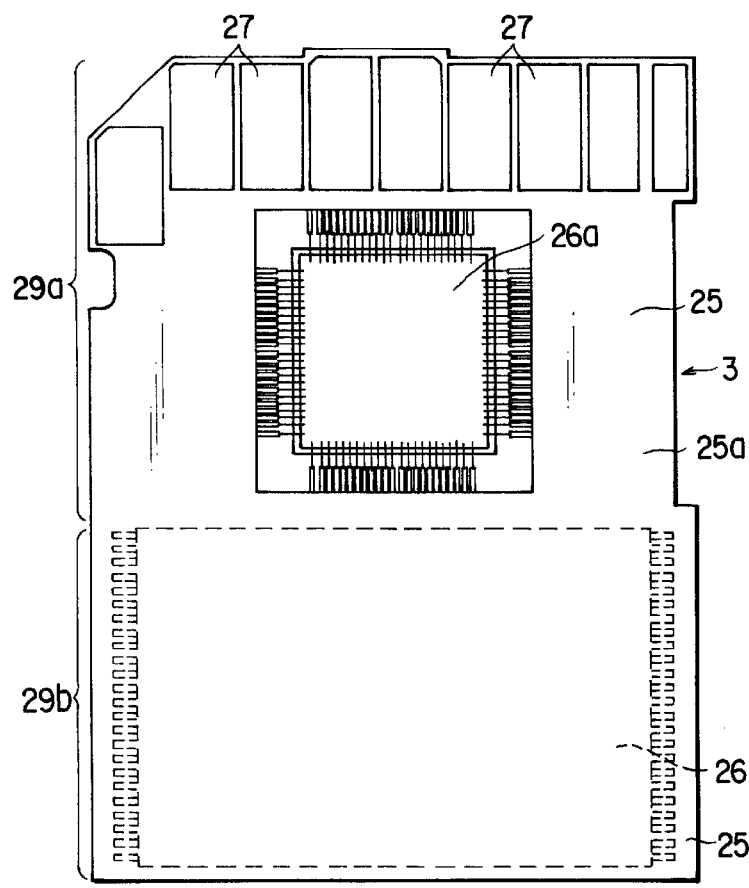
FIG. 8 is a plan view of a memory module in accordance with the first embodiment of the present invention.

The memory module 3 is housed in the receptacle 22 of the card case 2. As illustrated in FIGS. 1 and 8, the memory module 3 is provided with a circuit substrate 25, a single first electronic part 26a and a pair of second electronic parts 26b and 26c. The circuit substrate 25 is composed of an electrically insulating material capable of elastic deformation, such as a glass-epoxy resin, and has a thin sheet shape having a thickness of approximately 0.3 mm. The circuit substrate 25 has such a size that it is firmly fitted to the inside of the first case 8. The circumferential edge of the circuit substrate 25 is allowed to butt against the inner surface of the outer circumferential edge 10a of the first case 8.

The circuit substrate 25 has a first surface 25a and a second surface 25b that is positioned on the side opposite to the first surface 25a. The first surface 25a faces the bottom wall 10 of the first case 8. The second surface 25b faces the top wall 16 of the second case 9.

A plurality of power-apply terminals 27 are placed at the front end portion of the first surface 25a of the circuit substrate 25. The power-apply terminals 27 respectively have a rectangular shape, and aligned in one row in the width direction of the card case 2. These power-apply terminals 27 are superposed on the seat portion 10b of the bottom wall 10, and exposed to the outside of the card case 2 through the opening 12. For this reason, the front end portion of the circuit substrate 25 is raised slightly from the bottom wall 10 by the existence of the seat portion 10b. Therefore, the circuit substrate 25 is inclined to approach the bottom wall 10 from the front end portion toward the rear end portion.

Figure 9:
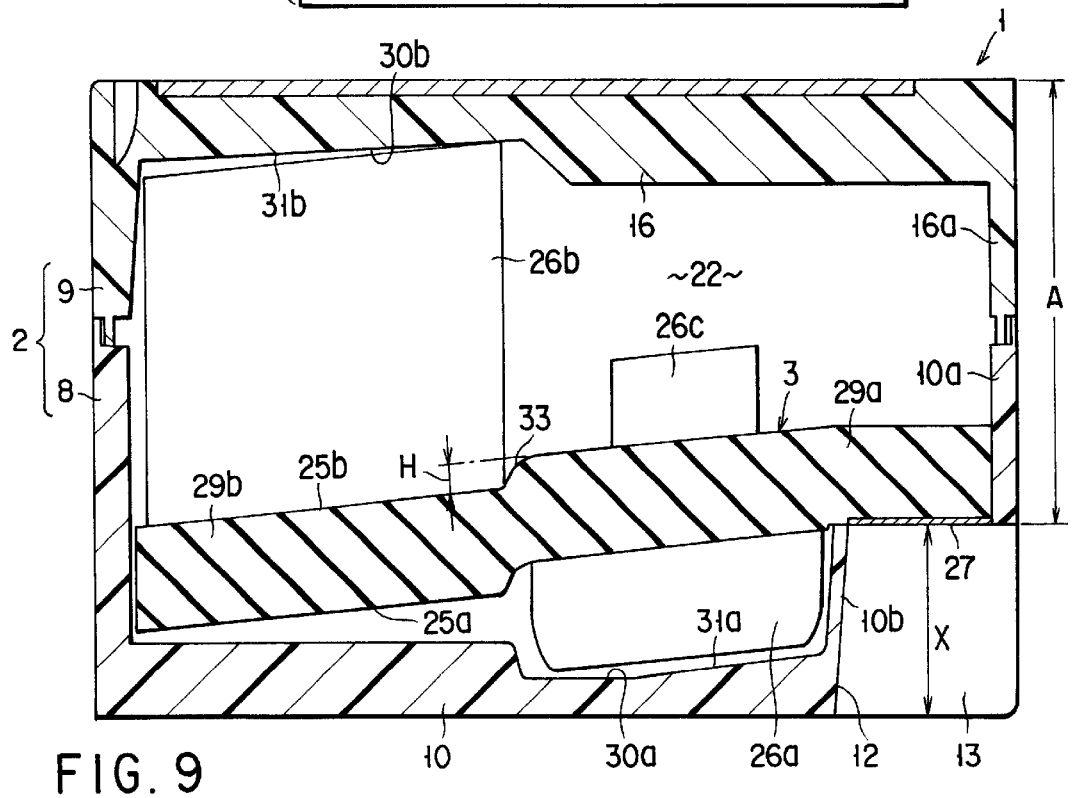
FIG. 9 is a cross-sectional view of the SD memory card of the first embodiment of the present invention, in which the thickness dimension of the card is enlarged by 10 times to the length dimension thereof so as to clarify the inclination and the shape of the step portion of a circuit substrate.

FIG. 9 is a cross-sectional view of the SD memory card 1 in which the thickness dimension of the card is enlarged by 10 times to the length dimension thereof, and FIG. 9 clearly shows how the inclination of the circuit substrate 25 is formed.

The first electronic part 26a is an LSI chip constituting a controller, and the LSI chip is mounted on the first surface 25 of the circuit substrate 25 by wire bonding. One of the second electronic parts 26b is an LSI package of an SOP type constituting a flash memory with a large capacity, and this LSI package is soldered to a pad on the second surface 25b of the circuit substrate 25. The other of the second electronic parts 26c is a capacitor, and this capacitor is smaller in size than the LSI chip and the LSI package of the SOP type. The capacitor is soldered to a pad on the second surface 25b. As illustrated in FIG. 4, one of the second electronic parts 26b and the other of the second electronic parts 26c are placed on the second surface 25b of the circuit substrate 25 in a separate manner from each other in the length direction of the card case 2. In this manner, the first and second electronic parts 26a through 26c are mounted on the respective surfaces, that is, the first surface 25a and the second surface 25b, in a separated manner from each other, and are electrically connected to the power-apply terminals 27 through a signal layer (not shown) of the circuit substrate 25.

The first electronic part 26a mounted on the first surface 25a and the second electronic parts 26b and 26c mounted on the second surface 25b are mounted on the circuit substrate 25 by using respectively different mounting methods. This arrangement in which the first and second electronic parts 26a through 26c, which are different in their mounting methods, are respectively placed on the first surface 25a and the second surface 25b of the circuit substrate 25 in a separate manner from each other has the following advantages: For example, in the case when, after the second electronic parts 26b and 26c have been soldered on the circuit substrate 25, the first electronic part 26a is mounted on the circuit substrate 25 by wire bonding, the bonding tool is free from interference with the second electronic parts 26b and 26c. For this reason, upon mounting the first electronic part 26a, the second electronic parts 26b and 26c do not interfere with the process; thus, it is possible to carry out the mounting process of the first electronic part 26a more easily.

As illustrated in FIG. 4, only the first electronic part 26a exists on the first surface 25a of the circuit substrate 25. Therefore, the first electronic part 26a is a largest part in its height dimension on the first surface 25a. Moreover, on the second surface 25b of the circuit substrate 25, one of the second electronic parts 26b is greater in its height dimension than the other second electronic part 26c. These first electronic part 26a and second electronic part 26b are placed apart from each other in the length direction of the card case 2 so as not to face each other with the circuit substrate 25 interpolated in between.

The circuit substrate 25 is provided with a first mount area 29a and a second mount area 29b. The first mount area 29a and the second mount area 29b are placed side by side along the length direction of the circuit substrate 25. The first mount area 29a is positioned on the front half of the circuit substrate 25, and on the first mount area 29a are placed the power-apply terminals 27, the second electronic part 26c and the first electronic part 26a that is the greatest in its height dimension on the first surface 25a. The second mount area 29b is placed on the rear half of the circuit substrate 25, and on the second package area 29b is placed the second electronic part 26b that is the greatest in its height dimension on the second surface 25b.

As illustrated in FIG. 4, the first electronic part 26a of the memory module 3 is placed between the circuit substrate 25 and the bottom wall 10. The second electronic parts 26b and 26c of the memory module 3 are placed between the circuit substrate 25 and the top wall 16. The bottom wall 10 has a first recess 30a at a portion facing the first electronic part 26a. The top wall 16 has a second recess 30b at a portion facing the second electronic part 26b. The recesses 30a and 30b are offset from each other in the length direction of the circuit substrate 25.

As most clearly shown in FIG. 9, the bottom surface 31a of the first recess 30a and the bottom surface 31b of the second recess 30b are respectively inclined so as to coincide with the inclinations of the circuit substrate 25. For this reason, at the position corresponding to the first recess 30a, the bottom wall 10 increases its thickness toward the front end of the card case 2. In contrast, at the position corresponding to the second recess 30b, the top wall 16 increases its thickness toward the rear end of the card case 2. Therefore, with respect to the bottom wall 10 and the top wall 16, the thickness increases from the middle portion toward the front side as well as toward the rear side in the length direction of the card case 2. Therefore, when the card case 2 is viewed as a whole, the balance of strength between the bottom wall 10 and the top wall 16 is well maintained.

As shown in FIG. 4, in the state where the memory module 3 is housed in the receptacle 22 of the card case 2, the front end of the first surface 25a of the circuit substrate 25 is pressed against the seat portion 10b of the first case 8 through the second case 9. In addition, the second electronic part 26b on the second surface 25b of the circuit substrate 25 is in contact with the bottom surface 31b of the second recess 30b. For this reason, the memory module 3 is sandwiched along the thickness direction of the card case 2; thus, the memory module 3 is positioned with respect to the receptacle 22.

AS illustrated in FIGS. 4 and 9, the circuit substrate 25 has a step portion 33 between the first mount area 29a and the second mount area 29b. The step portion 33 is bent toward the thickness direction of the card case 2. This step portion 33 is automatically formed when the memory module 3 is housed in the receptacle 22.

In other words, the second electronic part 26b, positioned at the second mount area 29b of the circuit substrate 25, is in contact with the bottom surface 31b of the second recess 30b so that the second mount area 29b of the circuit substrate 25 is subjected to a force pressing toward the bottom wall 10. Here, since the front end of the first mount area 29a of the circuit substrate 25 is received by the seat portion 10b raised upward from the bottom wall 10, the circuit substrate 25 is elastically bent along the thickness direction of the card case 2 between the first mount area 29a and the second mount area 29b, thereby forming the step portion 33.

For this reason, a gap H along the thickness direction of the card case 2 is formed between the first mount area 29a and the second mount area 29b. Therefore, the first and second electronic parts 26a and 26b that are respectively placed on the first surface 25a and the second surface 25b of the circuit substrate 25 in a separate manner and that are greatest in their height dimension on the respective surfaces are shifted respectively by a distance corresponding to the gap H in the approaching direction along the thickness direction of the card case 2.

The first mount area 29a of the circuit substrate 25 is raised from the bottom wall 10 due to the gap H and the inclination of the circuit substrate 25 of its own. Consequently, the power-apply terminals 27 placed on the first surface 25a of the circuit substrate 25 is positioned in the mid point along the thickness direction of the card case 2. The dimension A from the power-apply terminal 27 to the upper wall 16 of the second case 9 is preferably set to 30% to 70% of the thickness dimension of the card case 2.

Next, an explanation will be given of a sequence of assembling processes of the SD memory card 1.

First, the circuit substrate 25 of the memory module 3 is fitted to the inside of the first case 8, and the front end of the circuit substrate 25 is superposed on the seat portion 10b of the first case 8.

Next, the outer circumferential edge 16a of the second case 9 is superposed on the outer circumferential edge 10a of the first case 8. Thus, the joining surface 11 of the first case 8 and the butt surface 17 of the second case 9 are aligned face to face with each other so as to allow the tips of the melt-joining protrusions 18 to butt against the joining surface 11. In this state, the outer circumferential edge 10a of the first case 8 is placed on the fixed table 20, and the ultrasonic wave head 21 is allowed to butt against the outer circumferential portion of the top wall 16 of the second case 9. Consequently, the outer circumferential edge 10a of the first case 8 and the outer circumferential edge 16a of the second case 9 are sandwiched between the fixed table 20 and the ultrasonic wave head 21.

Next, ultrasonic vibration is applied to the outer circumferential portion of the top wall 16 of the second case 9 through the ultrasonic wave head 21. Then, the contact portions of the melt-joining protrusions 18 and the joining surface 11 are allowed to melt through vibrational friction so that the joining surface 11 and the butt surface 17 are melt-joined to each other in a contact state. Consequently, the first case 8 and the second case 9 are joined to each other.

When the first case 8 and the second case 9 are joined to each other, the receptacle 22 is formed between the bottom wall 10 and the top wall 16, and the memory module 3 is housed therein. Therefore, the first electronic part 26a is allowed to enter the first recess 30a of the bottom wall 10, and the second electronic part 26b is allowed to enter the second recess 30b of the top wall 16.

At this time, since the second electronic part 26b comes into contact with the bottom surface 31b of the recess 30b, the second mount area 29b of the circuit substrate 25 is pressed against the bottom wall 10 of the first case 8. Here, since the front end of the first mount area 29a of the circuit substrate 25 is supported by the mount portion 10b of the bottom wall 10, the circuit substrate 25 is elastically bent along the thickness direction of the card case 2 between the first mount area 29a and the second mount area 29b to form the step portion 33 at this place. Thus, the first mount area 29a and the second mount area 29b are housed inside the card case 2 with the gap H along the thickness direction of the card case 2.

In the SD memory card 1 having the above-mentioned arrangement, the tall first electronic part 26a and the tall second electronic part 26b are placed at positions offset from each other in the length direction of the circuit substrate 25 without facing each other with the circuit substrate 25 interpolated in between. Moreover, the circuit substrate 25 is provided with the step portion 33 between the first mount area 29a on which the first electronic part 26a is mounted and the second mount area 29b on which the second electronic part 26b is mounted, and the existence of the step portion 33 forms the gap H along the thickness direction of the card case 2 between the first mount area 29a and the second mount area 29b.

Thus, the first and second electronic parts 26a and 26b that are mounted on the respective first surface 25a and second surface 25b of the circuit substrate 25 in a separated manner and that are the greatest in their height dimension on the respective surfaces can be shifted in a manner so as to approach each other in the thickness direction of the card case 2. Therefore, in spite of the arrangement in which the electronic parts 26a to 26c are mounted on the respective first and second surfaces 25a and 25b of the circuit substrate 25 in a separated manner, it is possible to realize a thinner memory module 3.

As a result, it is only necessary for the receptacle 22 to have a height dimension obtained by subtracting the gap H from the value obtained by adding the thickness of the circuit substrate 25 and the height dimensions of the first and second electronic parts 26a and 26b. Therefore, as compared with the conventional apparatus having a flat circuit substrate, it is possible to reduce the thickness dimension of the card case 2 by a distance corresponding to the gap H on the circuit substrate 25, and consequently to provide a thinner, compact SD memory card 1.

Moreover, since the circuit substrate 25 has a bent shape with the gap H along the thickness direction of the card case 2, it is possible to shift the first mount area 29a of the circuit substrate 25 upward from the bottom wall 10 of the first case 8 by the distance corresponding to the gap H. Therefore, the power-apply terminals 27 placed on the first mount area 29a can be easily shifted to the mid position along the thickness direction of the card case 2; thus, it is possible to increase the degree of freedom in positioning the power-apply terminals 27 with respect to the card case 2.

Moreover, since the power-apply terminals 27 are shifted toward the top wall 16, the power-apply terminals 27 can be placed at a recessed position in the thickness direction of the card case 2. For this reason, as illustrated in FIG. 9, it is possible to sufficiently maintain the distance X from the power-apply terminals 27 to the opening edge of the opening 12 positioned on the bottom wall 10.

As a result, even when the SD memory card 1 is pinched by the fingers, the finger tip hardly touches the power-apply terminals 27, thereby making it possible to prevent the first and second electronic parts 26a through 26c from being damaged due to static electricity possessed by the human body. In addition, it is possible to prevent finger prints and oil components of the finger tip from adhering to the power-apply terminals 27, and consequently to preliminarily prevent power disconnection, etc.

Moreover, in the above-mentioned arrangement, the step portion 33 of the circuit substrate 25 is automatically formed since the second electronic part 26c is pressed by the top wall 16 when the circuit substrate 25 is interpolated between the first case 8 and the second case 9. For this reason, the step portion 33 is not susceptible to influences from dimensional tolerances, etc. of the first and second cases 8 and 9 and the circuit substrate 25. Therefore, even in such a minute construction in which a thin sheet of the circuit substrate 25 is housed in the flat receptacle 22 having a height dimension of less than 2 mm, it is possible to reasonably bend the circuit substrate 25.

Here, the circuit substrate 25 is inclined along the thickness direction of the card case 2; therefore, upon forming the step portion 33 in the circuit substrate 25, it is not necessary to apply an excessive force to the step portion 33. In addition, the length dimension from the bending start position to the bending end position of the step portion 33 can be shortened.

An explanation will be given of the reasons for these effects. Supposing that the circuit substrate 25 is placed in parallel with the bottom wall 10, an attempt to obtain a gap H as great as the above-mentioned construction on the circuit substrate 25 causes an abrupt bent angle of the circuit substrate 25 at the bending start point and the bending end point of the step portion 33. This results in an excessive stress at the step portion 33, and the possible damages to the circuit substrate 25. When the bent angle at the bending start point and bending end point of the step portion 33 is made smaller, the resulting structure causes an increase in the length dimension from the bending start point to the bending end point, failing to provide a compact circuit substrate 25.

Therefore, in an attempt to form the step portion 33 in the circuit substrate 25, it is preferable to incline the circuit substrate 25 in the thickness direction of the card case 2.

In accordance with the SD memory card 1 having the above-mentioned construction, in the outer circumferential edge 10a of the first case 8, the cut sections 14a and 14b are formed at portions corresponding to the long sides 4a and 4b of the card case 2 so as to decrease the thickness thereof; therefore, the thickness of the butt portions of the first case 8 and the second case 9 becomes thinner at the cut sections 14a and 14b.

For this reason, when the butt portions of the outer circumferential edge 10a of the first case 8 and the outer circumferential edge 16a of the second case 9 are subjected to ultrasonic wave vibration, the butt portions have a capacity reduced by the cut sections 14a and 14b in receiving the vibrational friction. Thus, it is possible to reduce the thermal strain occurring in the melt-joining portions of the first and second cases 8 and 9, and consequently to reduce the subsequent residual stress. As a result, it is possible to avoid cases in which, after the melt-joining process, the bottom wall 10 and the top wall 16 of the card case 2 are deformed in a warping manner, and the outer circumferential edges of the card case 2 are deformed outwards in a swelling manner.

In particular, in the present embodiment, the cut sections 14a and 14b are formed at the positions corresponding to the long sides 4a and 4b of the card case 2. For this reason, at portions having long melt-joining ranges of the first case 8a and the second case 9a, the capacity of the butt portions of the two cases 8 and 9 can be reduced. Therefore, the degree of flatness and positional precision of the card case 2 can be maintained more preferably.

Moreover, at the positions corresponding to the long sides 4a and 4b of the card case 2, the fixed table 20 is allowed to enter the cut sections 14a and 14b; therefore, the gap between the fixed table 20 and the ultrasonic wave head 21 is narrowed by a distance corresponding to the cut section 14a, 14b. For this reason, ultrasonic wave vibration applied to the butt portions of the first case 8 and the second case 9 from the ultrasonic head 21 can be swiftly absorbed by the fixed table 20.

Consequently, in spite of the arrangement in which the circuit substrate 25 of the memory module 3 is fitted to the inside of the first case 8, the ultrasonic wave vibration, applied from the ultrasonic wave head 21, is hardly transmitted to the first and second electronic parts 26a to 26c through the first case 8 and the circuit substrate 25. Therefore, it is possible to preliminarily prevent damages to the first and second electronic parts 26a to 26c, and consequently to improve the reliability of the SD memory card 1.

Moreover, in the outer circumferential edges 10a and 16a of the first and second cases 8 and 9, no cut sections 14a and 14b exist at portions corresponding to the short sides 5a and 5b of the card case 2, and the thickness of portions corresponding to the short sides 5a and 5b is the same as the thickness dimension of the card case 2. For this reason, the length of the receptacle 22 can be extended in the direction of the long sides 4a and 4b so that the receptacle 22 can be expanded without changing the size of the card case 2. Thus, it is possible to sufficiently maintain the capacity of the receptacle 22, and consequently to reasonably house the memory module 3 therein.

Figure 10:
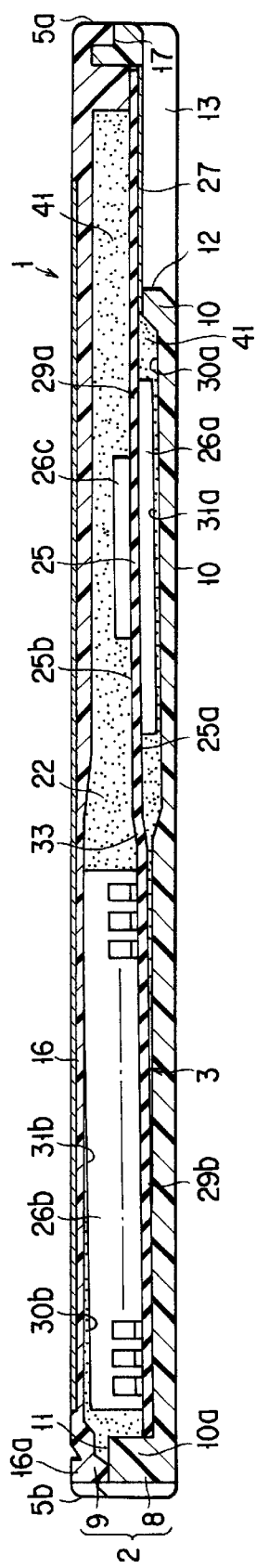
FIG. 10 is a cross-sectional view of an SD memory card in accordance with the second embodiment of the present invention.

Here, the present invention is not particularly limited to the first embodiment; and FIG. 10 shows the second embodiment of the present invention.

An SD memory card 1 to be disclosed in the second embodiment is different from that of the first embodiment in that the receptacle 22 of the card case 2 is filled with a reinforcing agent 41; and the other arrangements of the SD memory card 1 are the same as those of the first embodiment. Therefore, in the second embodiment, those members having the same structures as those of the first embodiment are indicated by the same reference numbers, and the description thereof is omitted.

With respect to the reinforcing agent 41, a synthetic resin material such as an epoxy resin is used. The reinforcing agent 41 is filled into the gap between the inner surface of the card case 2 and the memory module 3. The reinforcing agent 41 is filled into the receptacle 22 in the following sequence of processes.

First, liquid or grease reinforcing agent 41 is applied onto the bottom wall 10 of the first case 8. Then, the circuit substrate 25 of the memory module 3 is fitted to the inside of the first case 8, and the reinforcing agent 41 is sandwiched between the first surface 25a of the circuit substrate 25 and the bottom wall 10. Thus, the reinforcing agent 41 is allowed to enter the gap between the first case 8 and the memory module 3.

Next, liquid or grease reinforcing agent 41 is applied onto the second surface 25b of the circuit substrate 25. Thereafter, the second case 9 is put on the first case 8 so that the reinforcing agent 41 is sandwiched between the second face 25b of the circuit substrate 25 and the top wall 16 of the second case 9. Thus, the reinforcing agent 41 is allowed to enter the gap between the second case 9 and the memory module 3.

After a lapse of time required for the reinforcing agent 41 to set, ultrasonic wave vibration is applied to the butt portions between the outer circumferential edge 10a of the first case 8 and the outer circumferential edge 16a of the second case 9 in the same manner as the first embodiment to melt-join the two cases 8 and 9. Thus, an SD memory card 1 having the receptacle 22 filled with the reinforcing agent 41 is obtained.

In this arrangement, the reinforcing agent 41 is injected into the gap between the memory module 3 and the inner surface of the card case 2 so that the receptacle 22 becomes solid. For this reason, the mechanical strength of the SD memory card 1 is improved, and less susceptible to damage.

Here, in the first embodiment, the step portion is formed on the circuit substrate by sandwiching the circuit substrate between the first case and the second case; however, a step portion having a desired bent shape may be formed on the circuit substrate.

Moreover, in the first embodiment, the circuit substrate is inclined inside the card case and the step portion is formed between the first mount area and the second mount area of the circuit substrate; however, the present invention is not intended to be limited this structure, and the circuit substrate may simply be inclined in the thickness direction of the card case.

Even in this structure, the first and second electronic parts that are placed on the respective first and second surfaces of the circuit substrate in a separate manner can be shifted to approach each other in the thickness direction of the card case. Consequently, by making the circuit substrate thinner, it is possible to provide a thinner, compact memory module without forming the step portion on the circuit substrate, and consequently to achieve the object.

Moreover, in the first embodiment, in the outer circumferential edges of the first and second cases, cut sections are formed at portions corresponding to the long sides of the card case; however, for example, the cut sections may be formed along the entire circumferential edge including the short sides, or may be formed in adjacent one short side and one long side.

In addition, the card-type electronic apparatus of the present invention is not limited to the SD memory card, and for example, the present invention may be applied to another card such as a modem card with the same effects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A card-type electronic apparatus comprising:
a flat card case; and
a circuit module housed in the card case, said circuit module comprising: a circuit substrate having a first surface and a second surface positioned on the side opposite to the first surface, at least one first electronic part mounted on the first surface of the circuit substrate and at least one second electronic part mounted on the second surface of the circuit substrate, the first electronic part having the greatest height dimension on the first surface and the second electronic part having the greatest height dimension on the second surface being placed in an offset manner from each other without facing each other with the circuit substrate interpolated in between, the circuit substrate comprising a step portion for allowing the first electronic part having the greatest height dimension on the first surface and the second electronic part having the greatest height dimension on the second surface to be shifted in an approaching direction with each other along the thickness direction of the card case.

2. The card-type electronic apparatus according to claim 1, wherein the circuit substrate has a first mount area on which a first electronic part having the greatest height dimension is placed and a second mount area on which a second electronic part having the greatest height dimension is placed, the step portion being placed between the first mount area and the second mount area.

3. The card-type electronic apparatus according to claim 2, wherein the first mount area and the second mount area are inclined in the same direction along a thickness direction of the card case.

4. The card-type electronic apparatus according to claim 1, wherein the circuit substrate is inclined along a thickness direction of the card case.

5. The card-type electronic apparatus according to claim 4, wherein the card case comprises a first wall facing the first surface of the circuit substrate and a second wall facing the second surface of the circuit substrate, the first wall having a first recessed section in which the first electronic part having the greatest height dimension is inserted, the second wall having a second recessed section in which the second electronic part having the greatest height dimension is inserted.

6. The card-type electronic apparatus according to claim 5, wherein the first recessed section has a bottom facing the first electronic part having the greatest height dimension and the second recessed section has a bottom facing the second electronic part having the greatest height dimension, the bottoms of the first and second recessed sections being inclined along the circuit substrate.

7. The card-type electronic apparatus according to claim 1, wherein the first electronic part and the second electronic part are formed on the circuit substrate by using mutually different mounting methods.

8. The card-type electronic apparatus according to claim 1, wherein the card case has a first case and a second case that is aligned to butt against the first case, the circuit substrate being interpolated between the first case and the second case, either the first or second electronic part having the greatest height dimension being allowed to come into contact with an inner surface of either the first or second card case so that a force pressing in the thickness direction of the card case is exerted on the circuit substrate, thereby forming the step portion on the circuit substrate.

9. A card-type electronic apparatus comprising:
a flat card case; and
a circuit module housed in the card case, the circuit module comprising: a circuit substrate having a first surface and a second surface positioned on the side opposite to the first surface, at least one first electronic part mounted on the first surface of the circuit substrate and at least one second electronic part mounted on the second surface of the circuit substrate, the first electronic part having the greatest height dimension on the first surface and the second electronic part having the greatest height dimension on the second surface being placed in an offset manner from each other without facing each other with the circuit substrate interpolated in between, the circuit substrate being inclined along the thickness direction of the card case so that the inclined structure allows the first electronic part having the greatest height dimension and the second electronic part having the greatest height dimension to be shifted in an approaching direction with each other along the thickness direction of the card case.

10. The card-type electronic apparatus according to claim 9, wherein the circuit substrate has a first mount area on which a first electronic part having the greatest height dimension is placed and a second mount area on which a second electronic part having the greatest height dimension is placed, the first mount area and the second mount area being inclined in the same direction.

11. The card-type electronic apparatus according to claim 10, wherein the circuit substrate has a step portion that is bent along a thickness direction of the card case, the step portion being placed between the first mount area and the second mount area.

12. A card-type electronic apparatus comprising:

a flat card case having an opening; and a circuit module housed in the card case, the circuit module comprising: a circuit substrate having a first surface on which a power-apply terminal that is exposed to the opening is placed, a second surface positioned on the side opposite to the first surface, and an electronic part that is mounted at least on the second surface of the circuit substrate and that is electrically connected to the power-apply terminal, the circuit substrate being provided with a first mount area in which the power-apply terminal is positioned and a second mount area in which the electronic part is placed, the first mount area and the second mount area being offset from each other without overlapping with each other on the circuit substrate, as well as being shifted from each other along the thickness direction of the card case.

13. The card-type electronic apparatus according to claim 12, wherein the circuit substrate has a step portion that is placed between the first mount area and the second mount area so as to shift these mount areas along a thickness direction of the card case.

14. The card-type electronic apparatus according to claim 13, wherein the circuit module has at least one electronic part mounted on the first surface of the circuit substrate, the electronic part having the greatest height dimension on the first surface being placed on the first mount area of the circuit substrate, the step portion of the circuit substrate being bent so that the electronic part positioned on the first mount area and the electronic part positioned on the second mount area are shifted so as to approach each other in the thickness direction of the card case.

15. A card-type electronic apparatus comprising:

an electronic part; and a card case made of a synthetic resin, housing the electronic part, the card case comprising a first case having an outer circumferential edge and a second case having an outer circumferential edge, the outer circumferential edge of the first case and the outer circumferential edge of the second case being aligned to butt against each other, and integrally melt-joined to each other by applying ultrasonic wave vibration to these outer circumferential edges, the card case being provided with a cut section that is cut out so as to reduce the thickness thereof and that is formed at a position corresponding to at least one portion of the outer circumferential edges so that the first and second cases are melt-joined to each other at least at the position corresponding to the cut section.

16. The card-type electronic apparatus according to claim 15, wherein the card case has a pair of long sides and short sides located between the long sides, the cut section being positioned on each long side.

17. The card-type electronic apparatus according to claim 15, wherein the electronic part is mounted on the circuit substrate, the circuit substrate being firmly fitted to the inside of the first or second case.

18. The card-type electronic apparatus according to claim 17, wherein the outer circumferential edge of the first case and the outer circumferential edge of the second case are sandwiched between an ultrasonic wave head for applying ultrasonic wave vibration and a fixed table.

* * * * *

UNITED STATES PATENT AND TRADEMARK OFFICE
CERTIFICATE OF CORRECTION

PATENT NO.      : 6,381,143 B1
DATED           : April 30, 2002
INVENTOR(S)     : Nakamura It is certified that error appears in the above-identified patent and that said Letters Patent is hereby corrected as shown below:

<u>Title page, Item [54] and Column 1, line 1,</u>
Change "CARD-TYPED" to -- CARD-TYPE --.

Signed and Sealed this

Ninth Day of September, 2003

JAMES E. ROGAN
*Director of the United States Patent and Trademark Office*